United States Patent
Ogura et al.

(10) Patent No.: US 10,225,496 B2
(45) Date of Patent: Mar. 5, 2019

(54) PHOTOELECTRIC CONVERSION DEVICE HAVING A HOLDING CIRCUIT WITH A PLURALITY OF HOLDING UNITS PROVIDED FOR EACH OF A PLURALITY OF COLUMNS OF PIXELS AND METHOD OF DRIVING PHOTOELECTRIC CONVERSION DEVICE

(71) Applicant: CANON KABUSHIKI KAISHA, Tokyo (JP)

(72) Inventors: Masanori Ogura, Tokyo (JP); Jun Iba, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/414,047

(22) Filed: Jan. 24, 2017

(65) Prior Publication Data

US 2017/0237915 A1    Aug. 17, 2017

(30) Foreign Application Priority Data

Feb. 16, 2016  (JP) .................. 2016-026970

(51) Int. Cl.
  *H04N 3/14*    (2006.01)
  *H04N 5/335*   (2011.01)
  (Continued)

(52) U.S. Cl.
  CPC ..... *H04N 5/3595* (2013.01); *H01L 27/14621* (2013.01); *H01L 27/14641* (2013.01);
  (Continued)

(58) Field of Classification Search
  CPC ...... H04N 5/376; H04N 5/378; H04N 5/3651; H04N 9/045; H01L 27/14641;
  (Continued)

(56) References Cited

U.S. PATENT DOCUMENTS

| 7,227,208 B2 | 6/2007 | Ogura |
| 7,321,110 B2 | 1/2008 | Okita |

(Continued)

FOREIGN PATENT DOCUMENTS

| JP | S62-49765 | 3/1987 |
| JP | H02-250560 | 10/1990 |

(Continued)

OTHER PUBLICATIONS

U.S. Appl. No. 15/272,738, filed Sep. 22, 2016.
U.S. Appl. No. 15/410,299, filed Jan. 19, 2017.

*Primary Examiner* — Ngoc Yen T Vu
(74) *Attorney, Agent, or Firm* — Venable LLP

(57) ABSTRACT

A photoelectric conversion device includes a pixel array including pixels arranged in rows and columns, each of the pixels being configured to output a pixel signal, and including an optical filter and a photoelectric conversion unit, wherein the optical filters of different colors are arranged for each rows and each columns, a holding circuit including first holding units for each of the columns, the first holding units being configured to respectively hold the pixel signals read out from the pixels including the optical filters of different colors in one column of the pixel array in parallel, an output signal line, and a readout circuit configured to successively read out the pixel signals of pixels including the optical filters of the same color from the first holding units for each of the columns to the output signal line.

19 Claims, 9 Drawing Sheets

(51) Int. Cl.
  *H04N 5/217* (2011.01)
  *H04N 5/359* (2011.01)
  *H01L 27/146* (2006.01)
  *H01L 31/147* (2006.01)
  *H04N 5/378* (2011.01)
  *H04N 9/04* (2006.01)
  *H04N 5/365* (2011.01)

(52) U.S. Cl.
  CPC ...... *H01L 27/14645* (2013.01); *H01L 31/147* (2013.01); *H04N 5/3651* (2013.01); *H04N 5/378* (2013.01); *H04N 9/045* (2013.01)

(58) Field of Classification Search
  CPC ......... H01L 27/14643; H01L 27/14645; H01L 27/14621
  USPC .................................................. 348/308–310
  See application file for complete search history.

(56) References Cited

U.S. PATENT DOCUMENTS

| | | | |
|---|---|---|---|
| 7,408,210 B2 | 8/2008 | Ogura | |
| 7,456,880 B2 | 11/2008 | Okita | |
| 7,460,162 B2 | 12/2008 | Koizumi | |
| 7,514,732 B2 | 4/2009 | Okita | |
| 7,550,793 B2 | 6/2009 | Itano | |
| 7,593,047 B2 * | 9/2009 | Funakoshi | H04N 5/335 348/273 |
| 7,605,415 B2 | 10/2009 | Koizumi | |
| 7,629,568 B2 | 12/2009 | Koizumi | |
| 7,638,826 B2 | 12/2009 | Hiyama | |
| 7,679,658 B2 | 3/2010 | Sakurai | |
| 7,719,587 B2 | 5/2010 | Ogura | |
| 7,808,537 B2 | 10/2010 | Fujimura | |
| 7,812,873 B2 | 10/2010 | Hiyama | |
| 7,812,876 B2 | 10/2010 | Hiyama | |
| 7,906,755 B2 | 3/2011 | Koizumi | |
| 7,907,196 B2 | 3/2011 | Ogura | |
| 7,943,975 B2 | 5/2011 | Koizumi | |
| 7,948,540 B2 | 5/2011 | Ogura | |
| 7,978,241 B2 | 7/2011 | Koizumi | |
| 7,990,436 B2 * | 8/2011 | Mabuchi | H04N 3/155 250/208.1 |
| 8,053,718 B2 | 11/2011 | Koizumi | |
| 8,063,958 B2 | 11/2011 | Okita | |
| 8,134,190 B2 | 3/2012 | Okita | |
| 8,169,525 B2 | 5/2012 | Ryoki | |
| 8,174,600 B2 | 5/2012 | Ogura | |
| 8,207,561 B2 | 6/2012 | Koizumi | |
| 8,218,050 B2 | 7/2012 | Ogura | |
| 8,390,708 B2 | 3/2013 | Koizumi | |
| 8,411,178 B2 | 4/2013 | Ogura | |
| 8,416,329 B2 | 4/2013 | Hiyama | |
| 8,441,558 B2 | 5/2013 | Okita | |
| 8,477,224 B2 | 7/2013 | Ogura | |
| 8,493,487 B2 | 7/2013 | Takada | |
| 8,520,102 B2 | 8/2013 | Ogura | |
| 8,520,108 B2 | 8/2013 | Ogura | |
| 8,552,481 B2 | 10/2013 | Hiyama | |
| 8,624,307 B2 | 1/2014 | Koizumi | |
| 8,692,917 B2 * | 4/2014 | Takeda | H04N 5/3742 348/294 |
| 8,698,935 B2 * | 4/2014 | Okita | H01L 27/14603 348/221.1 |
| 8,749,675 B2 | 6/2014 | Koizumi | |
| 8,823,849 B2 | 9/2014 | Hiyama | |
| 8,896,029 B2 | 11/2014 | Koizumi | |
| 8,928,790 B2 | 1/2015 | Ogura | |
| 9,124,830 B2 | 9/2015 | Ogura | |
| 9,231,022 B2 | 1/2016 | Hiyama | |
| 9,261,769 B2 | 2/2016 | Tashiro | |
| 9,305,954 B2 | 4/2016 | Kato | |
| 9,774,801 B2 * | 9/2017 | Hseih | H04N 5/23235 |
| 2012/0181590 A1 | 7/2012 | Okita | |
| 2016/0005788 A1 | 1/2016 | Ogura | |
| 2016/0028985 A1 * | 1/2016 | Vogelsang | H01L 27/14641 348/294 |
| 2016/0071901 A1 | 3/2016 | Hiyama | |
| 2016/0218127 A1 | 7/2016 | Kato | |
| 2016/0247846 A1 | 8/2016 | Iida | |
| 2016/0334621 A1 | 11/2016 | Kawabata | |

FOREIGN PATENT DOCUMENTS

| | | |
|---|---|---|
| JP | H08-116402 | 5/1996 |
| JP | 2004-236028 | 8/2004 |

* cited by examiner

PHOTOELECTRIC CONVERSION DEVICE HAVING A HOLDING CIRCUIT WITH A PLURALITY OF HOLDING UNITS PROVIDED FOR EACH OF A PLURALITY OF COLUMNS OF PIXELS AND METHOD OF DRIVING PHOTOELECTRIC CONVERSION DEVICE

BACKGROUND OF THE INVENTION

Field of the Invention

The present invention relates to a photoelectric conversion device and a method of driving a photoelectric conversion device.

Description of the Related Art

As a color document reading unit of a document reading apparatus, such as a copying machine or a multi-function printer, there is known a color document reading unit using a photoelectric conversion device, such as a complementary metal oxide semiconductor (CMOS) image sensor or a charge coupled device (CCD) image sensor. In each of Japanese Patent Application Laid-Open Nos. S62-49765, H08-116402, and H02-250560, there is disclosed a photoelectric conversion device, which is configured to separate colors of a color document by red (R), green (G), and blue (B) optical filters to acquire image information.

In the photoelectric conversion device disclosed in Japanese Patent Application Laid-Open Nos. S62-49765, H08-116402, and H02-250560, pixels in a plurality of columns are arranged in a main scanning direction, and an R-pixel, a G-pixel, and a B-pixel are arranged periodically. Pixels in three rows are arranged in a sub-scanning direction, and the R-pixel, the G-pixel, and the B-pixel are arranged periodically.

In the photoelectric conversion device disclosed in Japanese Patent Application Laid-Open Nos. S62-49765, H08-116402, and H02-250560, when signals of pixels are read out in order along the main scanning direction, signals of the R-pixel, the G-pixel, and the B-pixel are read out in order. Potentials of the signals of the R-pixel, the G-pixel, and the B-pixel are often different from one another depending on the color document to be read. For example, assuming a case where the potential of the signal of the R-pixel is high, and the potential of the signal of the G-pixel is low, the signal of the G-pixel having the low potential, which is read out after the signal of the R-pixel having the high potential is read out, may have a potential that is higher than a true value. In this manner, when the signals of the R-pixel, the G-pixel, and the B-pixel are read out in order, so-called electric color mixing of the pixel signals has occurred in some cases under the effect of the signal of the previously-read pixel of a different color. When the electric color mixing occurs, color reproducibility may be reduced when the captured image is reproduced.

SUMMARY OF THE INVENTION

It is an object of the present invention to provide a photoelectric conversion device, which is capable of preventing electric color mixing between pixel signals acquired from pixels of different colors, and a method of driving the photoelectric conversion device.

According to one aspect of the present invention, there is provided a photoelectric conversion device including a pixel array including a plurality of pixels arranged in a plurality of rows and a plurality of columns, each of the plurality of pixels being configured to output a pixel signal, and including an optical filter and a photoelectric conversion unit configured to photoelectrically convert light transmitted through the optical filter, wherein the optical filters of different colors are arranged for each of the plurality of rows and each of the plurality of columns, a holding circuit, and an output signal line, wherein the holding circuit includes a plurality of first holding units for each of the plurality of columns, the plurality of first holding units being configured to respectively hold the pixel signals read out from a plurality of pixels including the optical filters of different colors in one column of the pixel array in parallel, and wherein the photoelectric conversion device further comprises a readout circuit configured to successively read out the pixel signals of pixels including the optical filters of the same color from the plurality of first holding units for each of the plurality of columns to the output signal line.

Further, according to another aspect of the present invention, there is provided a method of driving a photoelectric conversion device including a pixel array including a plurality of pixels arranged in a plurality of rows and a plurality of columns, each of the plurality of pixels being configured to output a pixel signal, and including an optical filter and a photoelectric conversion unit configured to photoelectrically convert light transmitted through the optical filter, wherein the optical filters of different colors are arranged for each of the plurality of rows and each of the plurality of columns, and a plurality of first holding units, the method including holding, by each of the plurality of first holding units, the pixel signals read out from a plurality of pixels including the optical filters of different colors in one column of the pixel array in parallel, and successively reading out the pixel signals of pixels including the optical filters of the same color from the plurality of first holding units for each of the plurality of columns.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

[First Embodiment]

Figure 1:
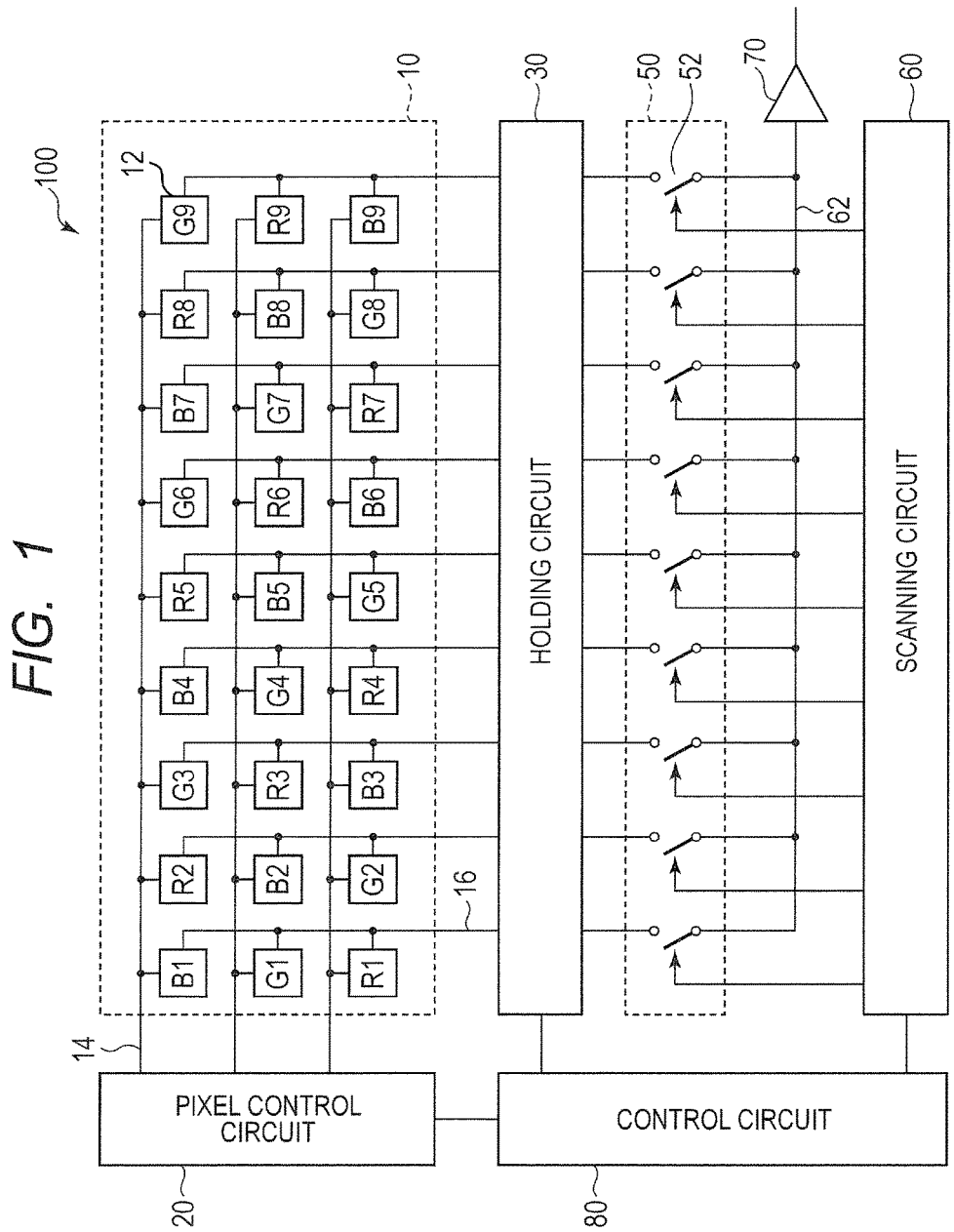
FIG. 1 is a schematic diagram for illustrating a configuration of a photoelectric conversion device according to a first embodiment of the present invention.
Figure 2:
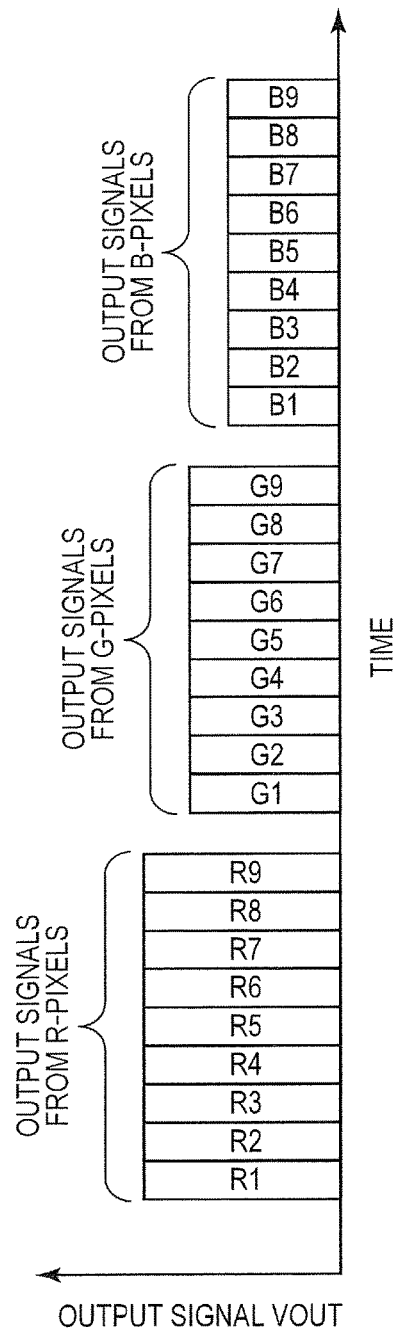
FIG. 2 is a graph for illustrating timings of output signals in the photoelectric conversion device according to the first embodiment of the present invention.
Figure 3:
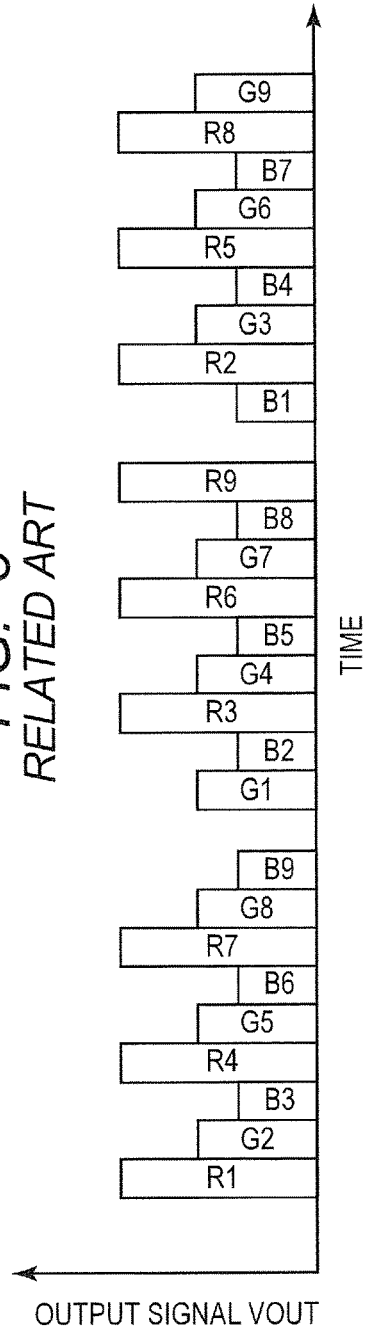
FIG. 3 is a graph for illustrating timings of output signals in a photoelectric conversion device according to a comparative example.

A photoelectric conversion device and a method of driving the same according to a first embodiment of the present invention will be described with reference to FIG. 1 to FIG. 3. FIG. 1 is a schematic diagram for illustrating a configuration of the photoelectric conversion device according to the present embodiment. FIG. 2 is a graph for illustrating timings of output signals in the photoelectric conversion device according to the present embodiment. FIG. 3 is a graph for illustrating timings of output signals in a photoelectric conversion device according to a comparative example.

First, the structure of the photoelectric conversion device according to the present embodiment is described with reference to FIG. 1.

As illustrated in FIG. 1, a photoelectric conversion device 100 according to the present embodiment includes a pixel array 10, a pixel control circuit 20, a holding circuit 30, a switching circuit 50, a scanning circuit 60, a readout amplifier 70, and a control circuit 80.

The pixel array 10 includes a plurality of pixels arranged in a plurality of rows and a plurality of columns. In this specification, the lateral direction in FIG. 1 is expressed as the row direction, horizontal direction, or main scanning direction, and the longitudinal direction in FIG. 1 is expressed as the column direction, vertical direction, or sub-scanning direction. The plurality of pixels 12 include R-pixels each having an optical filter configured to transmit light in a red (R) wavelength range arranged over an upper surface thereof, G-pixels each having an optical filter configured to transmit light in a green (G) wavelength range arranged over an upper surface thereof, and B-pixels each having an optical filter configured to transmit light in a blue (B) wavelength range arranged over an upper surface thereof. In FIG. 1, each pixel 12 is denoted by a reference symbol obtained by combining the color (R, G, or B) of the optical filter and a numeral indicating the column number for convenience. For example, the pixel 12 denoted by "G5" means a G-pixel located in the fifth column. In this specification, when a particular pixel 12 is specified, the pixel 12 may be expressed as the "pixel 12-G5" using the reference symbol in some cases. Moreover, each of switches 32, 36, 40, and 52, holding units 34 and 42, and other such components to be described later may be similarly denoted by a reference symbol with the symbol (R, G, or B) representing the color of the corresponding pixel 12 and the numeral representing the column in some cases.

Each column of the pixel array 10 includes pixels of all kinds, which are configured to output pixel signals corresponding to incident light, and are pixels 12 including optical filters of different colors, that is, at least one R-pixel, at least one G-pixel, and at least one B-pixel in this example. In other words, the pixel array 10, which includes the following three kinds of pixels 12: R-pixels, G-pixels, and B-pixels, includes at least three rows as illustrated in FIG. 1. Similarly in each row of the pixel array 10, pixels 12 of all kinds, which are configured to output pixel signals corresponding to the incident light, are regularly and repeatedly arranged. In the example of FIG. 1, the pixels 12 are repeatedly arranged in the following order: R-pixel, G-pixel, B-pixel, R-pixel, . . . in each row. In other words, the R-pixels, the G-pixels, and the B-pixels are arranged in a so-called dot-sequential manner. The number of columns of the pixel array 10 is determined as appropriate depending on a width, a resolution, and other such factors required in the main scanning direction. In FIG. 1, a 3×9 pixel array 10 is illustrated for simplicity, but a larger number of columns are arranged in reality.

In each row of the pixel array 10, a control signal line 14 is arranged to extend in the row direction. The control signal line 14 is a signal line common to pixels 12 arranged in the row direction. The control signal line 14 is connected to the pixel control circuit 20. Each of the control signal lines 14 typically includes a plurality of signal lines. In reading out a signal from each pixel 12, the pixel control circuit 20 supplies a control signal for driving a readout circuit in the pixel 12 to each control signal line 14.

In each column of the pixel array 10, a vertical output line bus 16, which is connected to pixels 12 in the corresponding column, is arranged to extend in the column direction. The vertical output line bus 16 is an output signal line for outputting pixel signals of the pixels 12. Each of the vertical output line buses 16 includes a plurality of vertical output lines respectively corresponding to the pixels 12 arranged in the column direction. For example, in the case of the pixel array 10 including the three rows as in the example of FIG. 1, the vertical output line bus 16 includes three signal lines individually connected to the three pixels 12. The photoelectric conversion device in the present embodiment may be configured to read out pixel signals row-sequentially from the pixel array 10, and in that case, the vertical output line bus 16 may be one vertical output line that is common to the three pixels 12 arranged in the column direction.

The vertical output line bus 16 is connected to the holding circuit 30. The holding circuit 30 at least includes a plurality of holding units corresponding to the number required to temporarily hold pixel signals output from all pixels 12 of the pixel array 10. Each of the holding units may be configured to be able to separately hold a photoelectric conversion signal (S signal) and a reset signal (N signal), which are output from a pixel 12.

The holding circuit 30 is connected to a horizontal output line 62 via the switching circuit 50. The horizontal output line 62 is an output signal line for outputting the pixel signals held by the holding units of the holding circuit 30. The switching circuit 50 is connected to the scanning circuit 60. The switching circuit 50 includes switches 52, which are controlled by the scanning circuit 60. The horizontal output line 62 is connected to the readout amplifier 70. With this configuration, the scanning circuit 60 controls the switches 52 of the switching circuit 50 so that the pixel signals held by the holding units of the holding circuit 30 may be successively output to the readout amplifier 70 via the horizontal output line 62.

The pixel control circuit 20, the holding circuit 30, and the scanning circuit 60 are connected to the control circuit 80, which is configured to control operations and their timings of the pixel control circuit 20, the holding circuit 30, and the scanning circuit 60. The control circuit 80 needs not necessarily be arranged in the photoelectric conversion device. The photoelectric conversion device may include a unit configured to receive control signals for controlling the pixel control circuit 20, the holding circuit 30, the scanning circuit 60, and other such components from an external control circuit.

Next, a method of driving the photoelectric conversion device according to the present embodiment is described with reference to FIG. 1 and FIG. 2.

First, from the pixel control circuit 20 to pixels 12 in each row via the control signal line 14, a control signal for driving a readout circuit in each of the pixels 12 is output. As a result, a pixel signal based on signal charges generated by photoelectric conversion is output from each pixel 12 to the holding circuit 30 via the vertical output line bus 16. With this configuration, pixel signals of the pixels 12 in all columns and all rows are simultaneously read out from the pixel array 10 to the holding circuit 30 (parallel reading). The pixel signals of the pixels 12 in all columns and all rows need not necessarily be read out in parallel, but may be read out sequentially for each row (row-sequential reading). As compared to the row-sequential reading, the parallel reading has an advantage in that signals may be read out from pixels 12 in a plurality of rows at high speed.

Next, in the holding circuit 30, predetermined electrical processing is performed as necessary on the pixel signals output from the pixel array 10, and the pixel signals from all pixels 12 are independently held by the holding units. The pixel signals read out from all pixels 12, that is, pixel signals read out from pixels including optical filters of different colors, are held by the holding units in parallel. Examples of the predetermined electrical processing in the holding circuit 30 include switching processing for holding pixel signals of the respective pixels in predetermined holding units, amplification processing for amplifying the pixel signals, and other such processing.

The pixel signals held by the holding circuit 30 are sequentially read out to the horizontal output line 62 (serial reading) when the switches 52 of the switching circuit 50 are sequentially operated in response to control signals from the scanning circuit 60. The pixel signal output to the horizontal output line 62 is read out after being subjected to predetermined electrical processing in the readout amplifier 70. Examples of the predetermined electrical processing in the readout amplifier 70 include amplification processing for amplifying the pixel signal, processing of subtracting a reset signal from the photoelectric conversion signal, and other such processing.

In the method of driving the photoelectric conversion device according to the present embodiment, the pixel signals held by the holding circuit 30 are successively read out for each kind of pixels 12 to the horizontal output line 62. For example, first, pixel signals of R-pixels in respective columns are successively and sequentially read out to the horizontal output line 62. Next, pixel signals of G-pixels in respective columns are successively and sequentially read out to the horizontal output line 62. Next, pixel signals of B-pixels in respective columns are successively and sequentially read out to the horizontal output line 62.

As a result, from the readout amplifier 70, as illustrated in FIG. 2, for example, pixel signals (output signals VOUT) of pixels 12 of the same color are successively read out. It may be expected that a variation in potential of the signals output from the readout amplifier 70 may be suppressed to a low level by successively reading out the pixel signals of the pixels 12 of the same color. As a result, a variation in pixel signal due to the effect of the pixel signal of the previously-read pixel 12 may be suppressed. In particular, as illustrated in FIG. 2, for example, when a difference in signal level among pixel signals of R-pixels, pixel signals of G-pixels, and pixel signals of B-pixels is large, the effect provided by successively reading out the pixel signals of the pixels 12 of the same color is significant.

The following case is assumed: the pixel signals of the pixels 12 are read out for each row when the difference in signal level among the pixel signals of the R-pixels, the G-pixels, and the B-pixels is large as illustrated in FIG. 3, for example. In this case, pixel signals of pixels 12 of different colors are successively read out from the readout amplifier 70. For example, after a pixel signal of a pixel 12-R1 is read out, a pixel signal of a pixel 12-G2 is read out. After the pixel signal of the pixel 12-R1 is read out and before the pixel signal of the pixel 12-G2 is read out, a reset operation of resetting the horizontal output line 62 is generally performed. However, when the resetting of the horizontal output line 62 is insufficient, the pixel signal of the pixel 12-G2 to be read out next may have a potential that is higher than a true value under the effect of the pixel signal of the pixel 12-R1 in some cases. Similarly, a pixel signal of a pixel 12-B3 may have a potential that is higher than a true value under the effect of the pixel signal of the pixel 12-G2 in some cases. Moreover, a pixel signal of a pixel 12-R3, which is read out after a pixel signal of a pixel 12-B2, may have a potential that is lower than a true value under the effect of the pixel signal of the pixel 12-B2 in some cases. As a result, there occurs a phenomenon in which a signal level of a pixel signal of a pixel 12 to be read out next is changed under the effect of a pixel signal of a pixel 12 of a different color, that is, so-called electric color mixing. Then, when a captured image is reproduced, a problem of reduced color reproducibility occurs. Such electric color mixing depends on responsiveness of the readout amplifier 70, and becomes more evident as a readout rate in the main scanning direction becomes higher.

In this regard, in the method of driving the photoelectric conversion device according to the present embodiment, the pixel signals of the pixels 12 of the same color in the respective columns are successively read out, and hence the above-mentioned electric color mixing does not occur, and the reduction in color reproducibility in reproducing the captured image may be suppressed.

As described above, according to the present embodiment, in the photoelectric conversion device including the pixel array including the pixels of different colors in each row and each column, the electric color mixing between pixel signals acquired from pixels of different colors may be prevented. As a result, the reduction in color reproducibility in reproducing the captured image may be suppressed.

[Second Embodiment]

Figure 4:
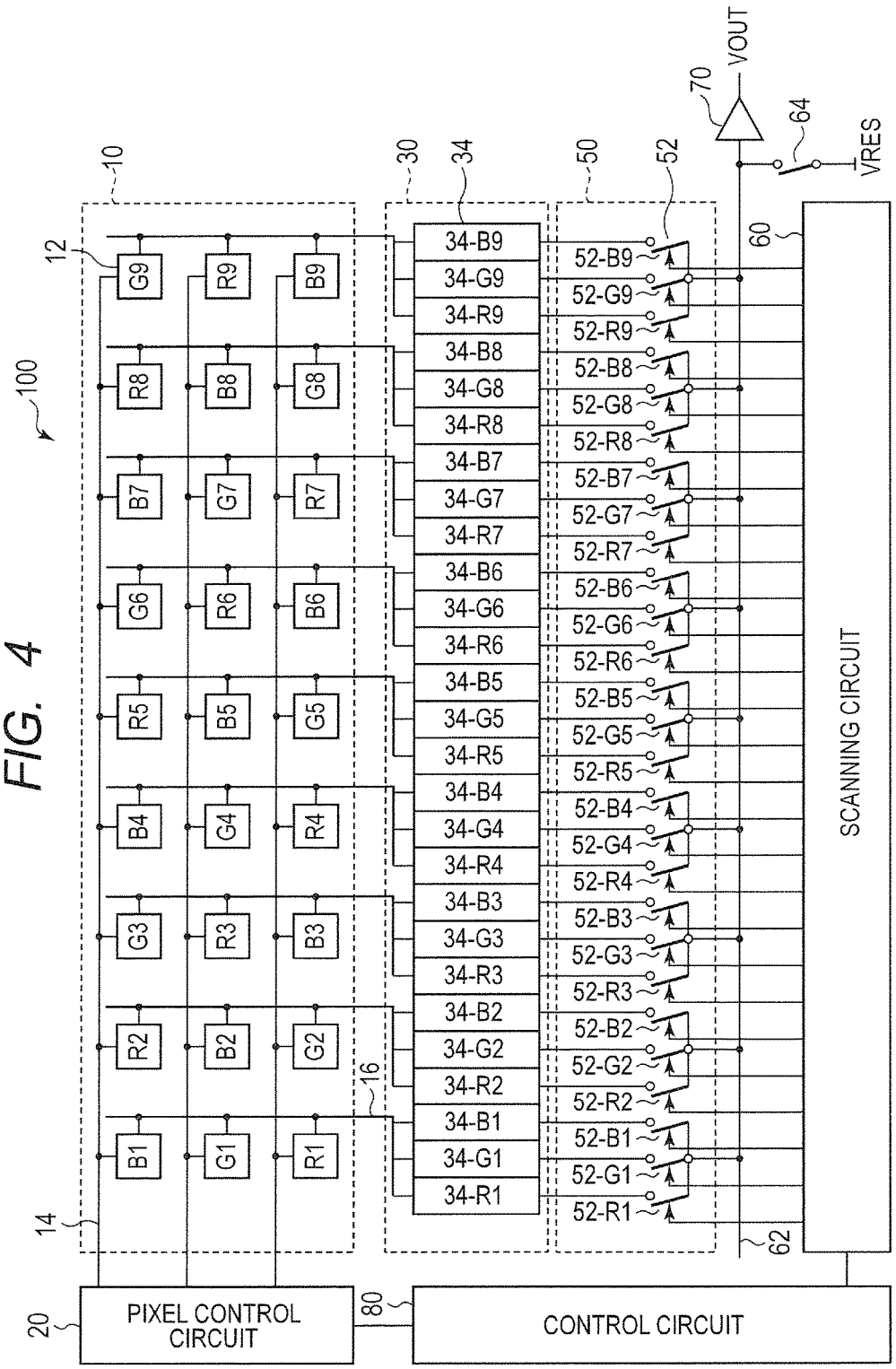
FIG. 4 is a schematic diagram for illustrating a configuration of a photoelectric conversion device according to a second embodiment of the present invention.
Figure 5:
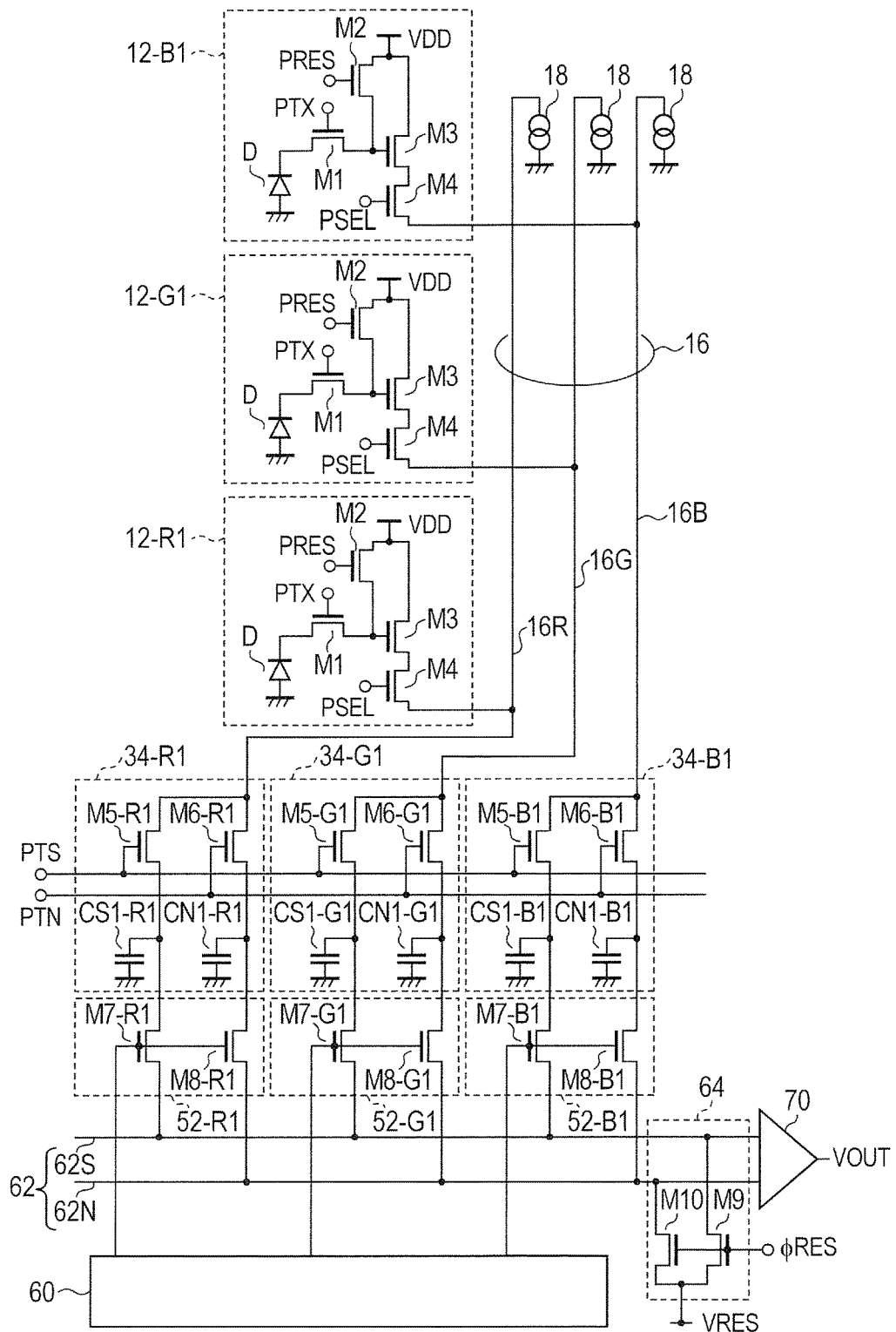
FIG. 5 is a circuit diagram for illustrating a configuration example of the photoelectric conversion device according to the second embodiment of the present invention.
Figure 6:
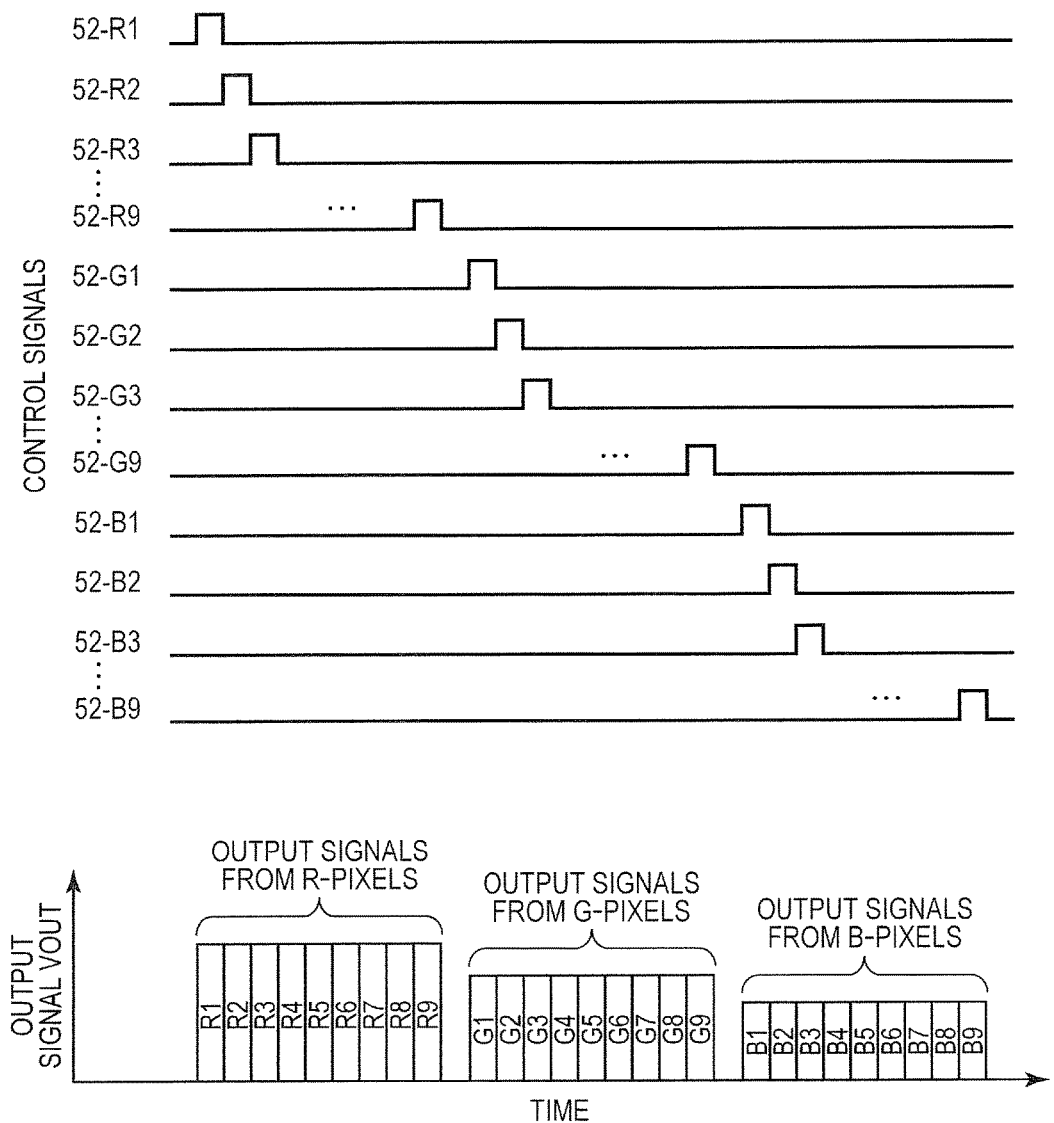
FIG. 6 is a chart and graph for illustrating timings of output signals in the photoelectric conversion device according to the second embodiment of the present invention.

A photoelectric conversion device and a method of driving the same according to a second embodiment of the present invention will be described with reference to FIG. 4 to FIG. 6. FIG. 4 is a schematic diagram for illustrating a configuration of the photoelectric conversion device according to the present embodiment. FIG. 5 is a circuit diagram for illustrating a configuration example of the photoelectric conversion device according the present embodiment. FIG. 6 is a chart and graph for illustrating timings of output signals in the photoelectric conversion device according to the present embodiment. Constitutional elements similar to those in the photoelectric conversion device according to the first embodiment illustrated in FIG. 1 to FIG. 3 are denoted by the same reference symbols, and the description thereof is omitted or simplified.

First, the structure of the photoelectric conversion device according to the present embodiment is described with reference to FIG. 4 and FIG. 5.

A basic configuration of the photoelectric conversion device according to the present embodiment is similar to that of the photoelectric conversion device according to the first embodiment illustrated in FIG. 1. The photoelectric conversion device according to the present embodiment is different from the photoelectric conversion device according to the first embodiment in the following points.

The holding circuit 30 includes a plurality of holding units 34 for each column of the pixel array 10. The plurality of holding units 34, which are provided for each column, respectively correspond to a plurality of pixels 12 arranged in the column. For example, when attention is focused on the first column of the pixel array in FIG. 4, holding units 34-R1, 34-G1, and 34-B1 are respectively provided to correspond to pixels 12-R1, 12-G1, and 12-B1 in three rows. The holding unit 34-R1 is a holding unit configured to hold a pixel signal output from the pixel 12-R1. The holding unit 34-B1 is a holding unit configured to hold a pixel signal output from the pixel 12-B1. The holding unit 34-G1 is a holding unit configured to hold a pixel signal output from the pixel 12-G1.

In the holding circuit 30, a holding unit 34-R configured to hold a pixel signal of an R-pixel, a holding unit 34-G configured to hold a pixel signal of a G-pixel, and a holding unit 34-B configured to hold a pixel signal of a B-pixel are regularly and repeatedly arranged. In the example of FIG. 4, the holding unit 34-R for the pixel signal of the R-pixel, the holding unit 34-G for the pixel signal of the G-pixel, and the holding unit 34-B for the pixel signal of the B-pixel are repeatedly arranged in the stated order.

Moreover, the switching circuit 50 includes a plurality of switches 52, each of which is arranged between a corresponding one of the plurality of holding units 34 and the horizontal output line 62. For example, when attention is focused on the first column of the pixel array in FIG. 4, a switch 52-R1 is arranged between the holding unit 34-R1 and the horizontal output line 62. Moreover, a switch 52-G1 is arranged between the holding unit 34-G1 and the horizontal output line 62. Moreover, a switch 52-B1 is arranged between the holding unit 34-B1 and the horizontal output line 62. Connection states of the plurality of switches 52 are controlled by control signals output from the scanning circuit 60. Moreover, a switch 64 is arranged between the horizontal output line 62 and a VRES voltage line.

The pixel array 10, the holding circuit 30, and the switching circuit 50 of the photoelectric conversion device according to the present embodiment may be formed of a circuit illustrated in FIG. 5, for example. In FIG. 5, constitutional elements of each unit are illustrated as an excerpt of a part corresponding to the first column.

Each of the pixels 12-R1, 12-G1, and 12-B1 includes a photodiode D, a transfer transistor M1, a reset transistor M2, an amplifier transistor M3, and a select transistor M4. The photodiode D is a photoelectric conversion unit configured to photoelectrically convert light transmitted through the optical filter to generate a charge.

The photodiode D has an anode connected to a ground voltage line, and a cathode connected to a source of the transfer transistor M1. The transfer transistor M1 has a drain connected to a source of the reset transistor M2 and a gate of the amplifier transistor M3. A connection node of the drain of the transfer transistor M1, the source of the reset transistor M2, and the gate of the amplifier transistor M3 forms a floating diffusion portion (hereinafter referred to as "FD portion"). Each of the reset transistor M2 and the amplifier transistor M3 has a drain connected to a power supply voltage line (voltage VDD). The amplifier transistor M3 has a source connected to a drain of the select transistor M4.

The transfer transistor M1 has a gate, to which a transfer gate signal PTX for driving the transfer transistor M1 is supplied from the pixel control circuit 20 via a transfer gate signal line (not illustrated). The reset transistor M2 has a gate, to which a reset signal PRES for driving the reset transistor M2 is supplied from the pixel control circuit 20 via a reset signal line (not illustrated). The select transistor M4 has a gate, to which a select signal PSEL for controlling the select transistor M4 is supplied from the pixel control circuit 20 via a select signal line (not illustrated). The transfer gate signal line, the reset signal line, and the select signal line are included in each of the control signal lines 14 of FIG. 4.

The vertical output line bus 16 includes vertical output lines 16R, 16G, and 16B. The vertical output line 16R is connected to a source of the select transistor M4 of the pixel 12-R1. The vertical output line 16G is connected to a source of the select transistor M4 of the pixel 12-G1. The vertical output line 16B is connected to a source of the select transistor M4 of the pixel 12-B1. Each of the vertical output lines 16R, 16G, and 16B has one end connected to a current source 18.

Each of the holding units 34-R1, 34-G1, and 34-B1 includes transistors M5 and M6 and capacitors CS1 and CN1. Moreover, each of the switches 52-R1, 52-G1, and 52-B1 includes transistors M7 and M8.

When the holding unit 34-R1 and the switch 52-R1 are described as an example, each of transistors M5-R1 and M6-R1 has a drain connected to another end of the vertical output line 16R. The transistor M5-R1 has a gate, to which a control signal PTS is supplied from the control circuit 80. The transistor M6-R1 has a gate, to which a control signal PTN is supplied from the control circuit 80. The transistor M5-R1 has a source connected to one terminal of a capacitor CS1-R1 and a drain of a transistor M7-R1. The capacitor CS1-R1 has another terminal connected to the ground voltage line. The transistor M7-R1 has a source connected to a horizontal output line 62S. The transistor M6-R1 has a source connected to one terminal of a capacitor CN1-R1 and a drain of a transistor M8-R1. The capacitor CN1-R1 has another terminal connected to the ground voltage line. The transistor M8-R1 has a source connected to a horizontal output line 62N. Each of the transistors M7-R1 and M8-R1 has a gate connected to the scanning circuit 60. The same is true for the holding units 34-G1 and 34-B1 and the switches 52-G1 and 52-B1.

The switch 64 includes transistors M9 and M10. Each of the transistors M9 and M10 has a drain connected to the VRES voltage line. The transistor M9 has a source connected to the horizontal output line 62S. The transistor M10 has a source connected to the horizontal output line 62N. Each of the transistors M9 and M10 has a gate, to which a control signal φRES is supplied from the control circuit 80. The switch 64 forms a reset circuit configured to reset potentials of the horizontal output lines 62S and 62N.

Next, the method of driving the photoelectric conversion device according to the present embodiment is described with reference to FIG. 4 to FIG. 6.

First, a high-level transfer gate signal PTX and a high-level reset signal PRES are output to the pixels 12 from the pixel control circuit 20 via the control signal lines 14 to turn the transfer transistors M1 and the reset transistors M2 on. As a result, a power supply voltage is applied to the photodiode D of each pixel 12 via the transfer transistor M1 and the reset transistor M2 to reset a potential of the photodiode D. After the operation of resetting the photodiode D is performed, the transfer gate signal PTX and the reset signal PRES are set to a low level to disconnect the photodiode D from the power supply voltage. As a result, the photodiode D starts an operation of accumulating signal charges corresponding to an amount of incident light.

After a predetermined accumulation period is elapsed, the high-level reset signal PRES is output to the pixel 12 from the pixel control circuit 20 via the control signal line 14 to turn the reset transistor M2 on. As a result, the power supply voltage is applied to the FD portion via the reset transistor M2 to reset a potential of the FD portion. After the operation of resetting the FD portion is performed, the reset signal PRES is set to a low level to disconnect the FD portion from the power supply voltage. This completes the operation of resetting the FD portion.

Next, a high-level select signal PSEL is output from the pixel control circuit 20 via the control signal line 14 to turn the select transistor M4 of each pixel 12 on. The amplifier transistor M3 enters a state in which a bias current is supplied from the current source 18 via the select transistor M4 to form a source-follower circuit. As a result, a signal (reset signal) corresponding to a reset voltage of the FD portion is output to the vertical output line bus 16 via the select transistor M4. At this time, the control signal PTN is set to a high level to turn the transistor M6 on, to thereby hold the reset signal output from the vertical output line bus 16 in the capacitor CN1.

Next, a high-level transfer gate signal PTX is output from the pixel control circuit 20 via the control signal line 14 to turn the transfer transistor M1 on. As a result, signal charges generated and accumulated in the photodiode D are transferred to the FD portion via the transfer transistor M1. As a result, the FD portion has a voltage obtained by adding a voltage in accordance with an amount of the signal charges transferred to the FD portion and a capacitance value of the FD portion to the reset voltage. As a result, a signal (photoelectric conversion signal) corresponding to the amount of the signal charges transferred to the FD portion is output to the vertical output line bus 16 via the select transistor M4. At this time, the control signal PTS is set to a high level to turn the transistor M5 on, to thereby hold the photoelectric conversion signal output from the vertical output line bus 16 in the capacitor CS1.

As described above, the pixel signals of the pixels 12 in all columns and all rows are simultaneously read out from the pixel array 10 to the holding circuit 30 in parallel, and the pixel signals of all pixels 12 are independently held by the holding units 34. For example, when attention is focused on the first column of the pixel array 10, the pixel signal output from the pixel 12-R1 is held by the holding unit 34-R1. The pixel signal output from the pixel 12-G1 is held by the holding unit 34-G1. The pixel signal output from the pixel 12-B1 is held by the holding unit 34-B1. Pixel signals output from the other pixels 12 are similarly held by the holding units 34 corresponding to the pixels 12.

The pixel signals of all pixels 12 need not necessarily be read out simultaneously, and may be read out sequentially for each row, for example. In this case, the pixel control circuit 20 may function as a vertical scanning circuit. Alternatively, an amplifier circuit may be inserted in the preceding stage of the holding units 34, and pixel signals amplified by the amplifier circuit may be held by the holding units 34.

The pixel signals held by the holding units 34 of the holding circuit 30 are sequentially read out to the horizontal output line 62 when the switches 52 of the switching circuit 50 are sequentially operated in a predetermined order in response to the control signals from the scanning circuit 60. First, a high-level control signal is output from the scanning circuit 60 to the switches 52 to turn the transistors M7 and M8 on, to thereby read out the signals held in the capacitors CS1 and CN1 to the horizontal output lines 62S and 62N, respectively. Next, the transistors M9 and M10 are driven with the control signal ϕRES to reset the potentials of the horizontal output lines 62S and 62N to the voltage VRES. This series of operations may be sequentially and repeatedly performed on the holding units 34 to successively output the signals from all pixels 12 to the horizontal output lines 62S and 62N.

On the photoelectric conversion signal output to the horizontal output line 62S and the reset signal output to the horizontal output line 62N, differential processing is performed in the readout amplifier 70. As a result, an output signal VOUT, which is a differential signal between the photoelectric conversion signal and the reset signal, is output from the readout amplifier 70. The differential operation between the photoelectric conversion signal and the reset signal may be performed by the readout amplifier 70 to cancel a noise signal resulting from a variation in characteristics, such as a threshold voltage of the amplifier transistor M3 of the pixel portion, to thereby obtain an output signal having a high signal-to-noise (S/N) ratio.

In the method of driving the photoelectric conversion device according to the present embodiment, in reading out the pixel signals held by the holding circuit 30, the pixel signals are successively read out for each kind of the pixels 12.

FIG. 6 is an example of a timing chart of control signals output from the scanning circuit 60 to control nodes of the switches 52. The control signals are respectively denoted by the reference symbols of the corresponding switches 52. When those control signals are at a high level, the corresponding switches 52 are on state, and when those control signals are at a low level, the corresponding switches 52 are off state.

First, switches 52-R1, 52-R2, 52-R3, . . . , 52-R9 are sequentially turned on so that the pixel signals of the R-pixels are successively read out to the horizontal output line 62. Next, switches 52-G1, 52-G2, 52-G3, . . . , 52-G9 are sequentially turned on so that the pixel signals of the G-pixels are successively read out to the horizontal output line 62. Next, switches 52-B1, 52-B2, 52-B3, . . . , 52-B9 are sequentially turned on so that the pixel signals of the B-pixels are successively read out to the horizontal output line 62. The order in which the R-pixels, the G-pixels, and the B-pixels are read out is not limited to the example of FIG. 6, and may be selected arbitrarily.

Consequently, pixel signals of pixels 12 of the same color are successively read out from the readout amplifier 70 as illustrated in FIG. 6, for example. As a result, as described in the first embodiment, the electric color mixing between the pixel signals may be prevented, and the reduction in color reproducibility in reproducing the captured image may be suppressed.

Moreover, the pixel signals of all pixels may be held by the holding circuit 30 regularly in order of the R-pixel, the G-pixel, and the B-pixel to simplify control of the order in which the switches 52 are driven.

In a color line sensor having a line-sequential arrangement in which R-pixels, G-pixels, and B-pixels are allocated to different rows, reading out may be performed for each row to successively read out pixel signals of pixels of the same color. However, in a color line sensor in which colors are arranged in a dot-sequential arrangement, such as the photoelectric conversion device according to the present embodiment, when the same reading order as that of the color line sensor in which colors are arranged in the line-sequential arrangement is to be adopted, processing of rearranging the order of signals is required after analog-to-digital (AD) conversion of output signals of the line sensor. Therefore, a large memory is required, and the processing of rearranging the signals takes time.

In this regard, in the photoelectric conversion device according to the present embodiment, with a simple switching operation in the switching circuit 50, pixel signals of pixels 12 of the same color may be successively read out without requiring the large memory and the processing of rearranging the signals.

Moreover, in the photoelectric conversion device according to the present embodiment, pixel signals of pixels 12 of the same color may be successively read out to one channel of the horizontal output line 62. Moreover, it is not necessary to provide channels for three colors corresponding to R, G, and B. As a result, the circuit scale and power consumption may be reduced.

As described above, according to the present embodiment, in the photoelectric conversion device including the pixel array including the pixels of different colors in each row and each column, the electric color mixing between pixel signals acquired from pixels of different colors may be prevented. As a result, the reduction in color reproducibility in reproducing the captured image may be suppressed.

[Third Embodiment]

Figure 7:
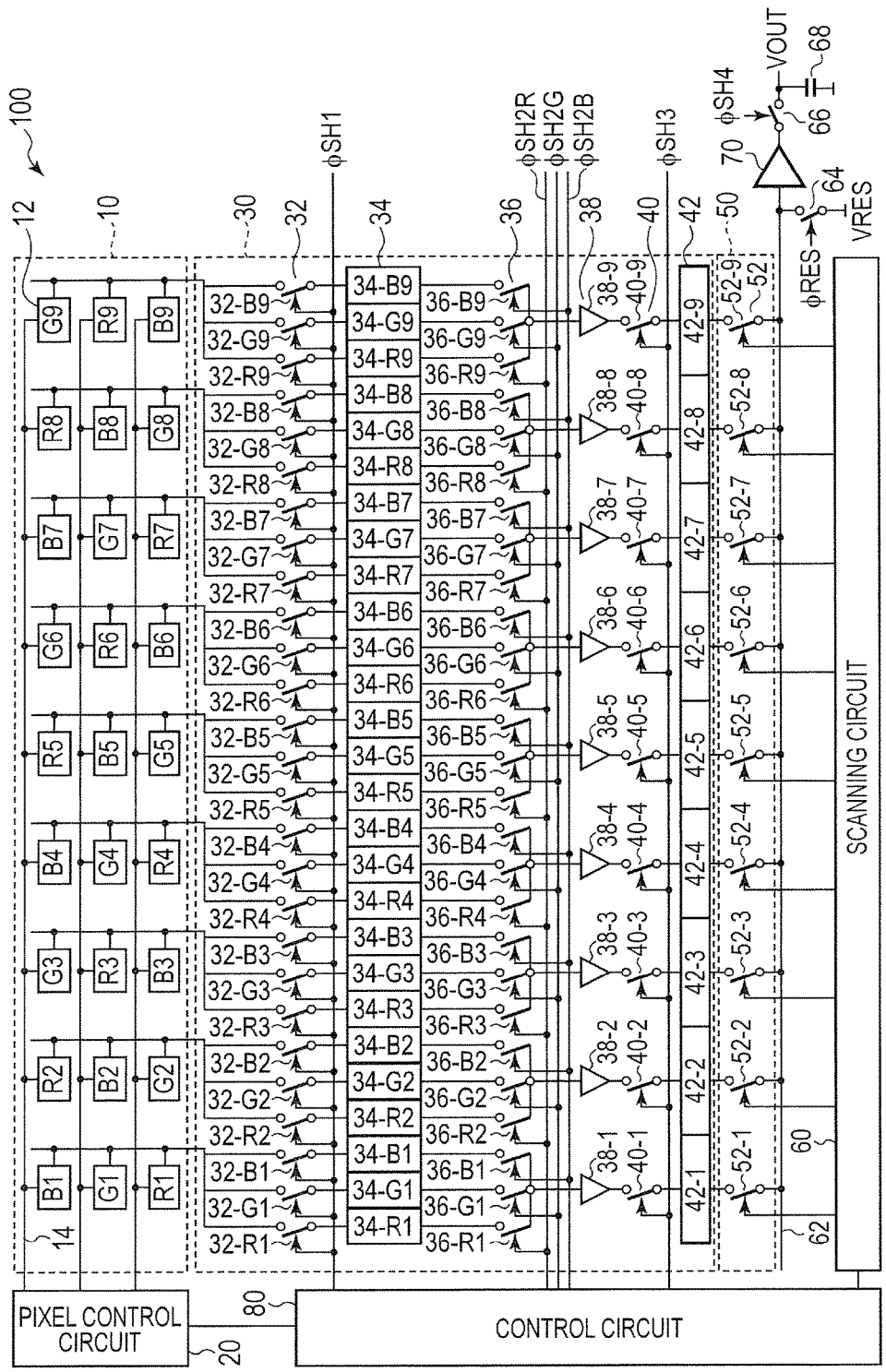
FIG. 7 is a schematic diagram for illustrating a configuration of a photoelectric conversion device according to a third embodiment of the present invention.
Figure 8:
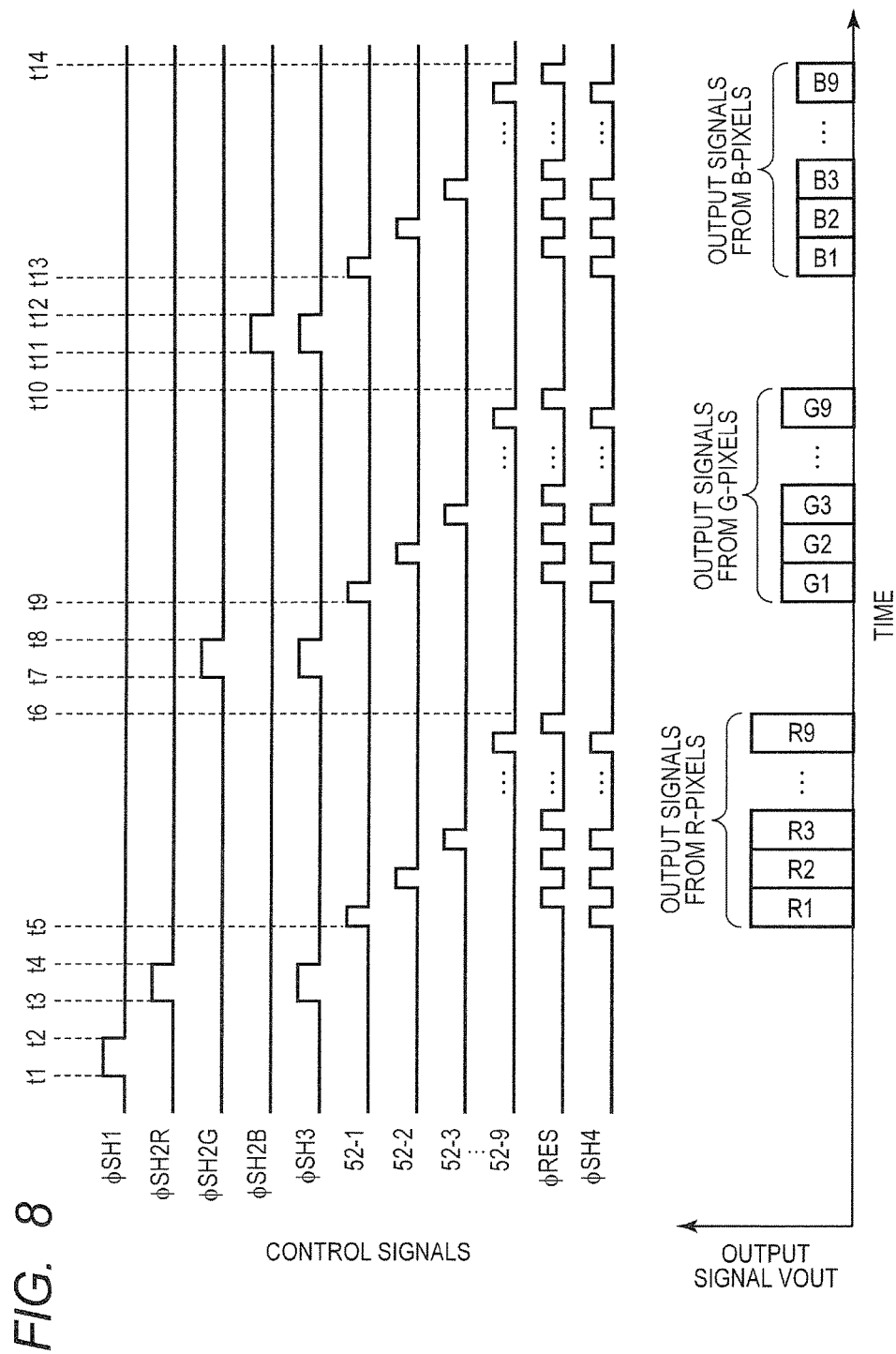
FIG. 8 is a chart and graph for illustrating timings of output signals in the photoelectric conversion device according to the third embodiment of the present invention.

A photoelectric conversion device and a method of driving the same according to a third embodiment of the present invention will be described with reference to FIG. 7 and FIG. 8. FIG. 7 is a schematic diagram for illustrating a configuration of the photoelectric conversion device according to the present embodiment. FIG. 8 is a chart and graph for illustrating timings of output signals in the photoelectric conversion device according to the present embodiment. Constitutional elements similar to those in the photoelectric conversion devices according to the first and second embodiments illustrated in FIG. 1 to FIG. 6 are denoted by the same reference symbols, and the description thereof is omitted or simplified.

First, the structure of the photoelectric conversion device according to the present embodiment is described with reference to FIG. 7.

A basic configuration of the photoelectric conversion device according to the present embodiment is similar to that of the photoelectric conversion device according to the first embodiment illustrated in FIG. 1. The photoelectric conversion device according to the present embodiment is different from the photoelectric conversion device according to the first embodiment in the following points.

The holding circuit 30 includes a plurality of switches 32, a plurality of first holding units 34, a plurality of switches 36, a buffer circuit 38, a switch 40, and a second holding unit 42 for each column of the pixel array 10. Moreover, the switching circuit 50 includes a switch 52 for each column of the pixel array 10.

The plurality of switches 32, the plurality of first holding units 34, and the plurality of switches 36, which are provided for each column, respectively correspond to a plurality of pixels 12 arranged in the column.

For example, when attention is focused on the first column of the pixel array 10 in FIG. 7, switches 32-R1, 32-G1, and 32-B1 are provided to respectively correspond to pixels 12-R1, 12-G1, and 12-B1. Moreover, first holding units 34-R1, 34-G1, and 34-B1 are provided to respectively correspond to the pixels 12-R1, 12-G1, and 12-B1. Moreover, switches 36-R1, 36-G1, and 36-B1 are provided to respectively correspond to the pixels 12-R1, 12-G1, and 12-B1.

The switch 32-R1 is arranged between the pixel 12-R1 and the first holding unit 34-R1. The switch 32-G1 is arranged between the pixel 12-G1 and the first holding unit 34-G1. The switch 32-B1 is arranged between the pixel 12-B1 and the first holding unit 34-B1. Each of the switches 32-R1, 32-G1, and 32-B1 is controlled with a control signal φSH1 input to a control node thereof, and enters an on state when the control signal φSH1 is at a high level, and an off state when the control signal φSH1 is at a low level, for example. The control signal φSH1 is output from the control circuit 80 or another control circuit. Each of the switches 32 may be formed of a switch forming a part of the holding unit 34, that is, the transistors M5 and M6 of FIG. 5, for example.

The switch 36-R1 is arranged between the first holding unit 34-R1 and a buffer circuit 38-1. The switch 36-G1 is arranged between the first holding unit 34-G1 and the buffer circuit 38-1. The switch 36-B1 is arranged between the first holding unit 34-B1 and the buffer circuit 38-1. The switch 36-R1 is controlled with a control signal φSH2R input to a control node thereof, and enters an on state when the control signal φSH2R is at a high level, and an off state when the control signal φSH2R is at a low level, for example. The switch 36-G1 is controlled with a control signal φSH2G input to a control node thereof, and enters an on state when the control signal φSH2G is at a high level, and an off state when the control signal φSH2G is at a low level, for example. The switch 36-B1 is controlled with a control signal φSH2B input to a control node thereof, and enters an on state when the control signal φSH2B is at a high level, and an off state when the control signal φSH2B is at a low level, for example. The control signals φSH2R, φSH2G, and φSH2B are output from the control circuit 80 or another control circuit.

The buffer circuit 38-1 is connected to a second holding unit 42-1 via a switch 40-1. The switch 40-1 is controlled with a control signal φSH3 input to a control node thereof, and enters an on state when the control signal φSH3 is at a high level, and an off state when the control signal φSH3 is at a low level, for example. The control signal φSH3 is output from the control circuit 80 or another control circuit.

The second holding unit 42-1 is connected to the horizontal output line 62 via a switch 52-1 of the switching circuit 50. The second holding unit 42-1 may be formed of a circuit similar to the first holding unit 34-R1 or the like illustrated in FIG. 5. The switch 52-1 is controlled with a control signal output from the scanning circuit 60, and enters an on state when the control signal is at a high level, and an off state when the control signal is at a low level, for example.

The same is true for the plurality of switches 32, the plurality of first holding units 34, the plurality of switches 36, the buffer circuit 38, the switch 40, and the second holding unit 42, which are provided to correspond to another column of the pixel array 10.

A first holding unit 34-R configured to hold a pixel signal of an R-pixel, a first holding unit 34-G configured to hold a pixel signal of a G-pixel, and a first holding unit 34-B configured to hold a pixel signal of a B-pixel are repeatedly arranged in a predetermined order as in the second embodiment. In the example of FIG. 7, the first holding unit 34-R for the pixel signal of the R-pixel, the first holding unit 34-G for the pixel signal of the G-pixel, and the first holding unit 34-B for the pixel signal of the B-pixel are repeatedly arranged in the stated order.

Moreover, a switch 64, which is controlled with a control signal φRES, is arranged between the horizontal output line 62 and the VRES voltage line. The readout amplifier 70 has an output node connected to a capacitor 68 via a switch 66, which is controlled with a control signal φSH4. The switches 64 and 66 enter an on state when the control signals φRES and φSH4 are at a high level, and an off state when the control signals φRES and φSH4 are at a low level, for example. The control signals φRES and φSH4 are output from the control circuit 80 or another control circuit.

Next, the method of driving the photoelectric conversion device according to the present embodiment is described with reference to FIG. 8.

After a predetermined exposure period is elapsed, at time t1, the control signal φSH1 is caused to transition from the low level to the high level to turn all switches 32 on, to thereby connect the respective pixels 12 to the corresponding first holding units 34 via the switches 32. As a result, the pixel signals of all pixels 12 are respectively held by the corresponding first holding units 34.

Next, at time t2, the control signal φSH1 is caused to transition from the high level to the low level to turn all switches 32 off.

Next, at time t3, the control signal φSH2R and the control signal φSH3 are caused to transition from the low level to the high level to turn the switches 36-R and the switches 40 on. As a result, the first holding unit 34-R in each column is connected to the second holding unit 42 in each column via the switch 36-R, the buffer circuit 38, and the switch 40. Then, the pixel signal held by the first holding unit 34-R in each column is held by the second holding unit 42 in each column after being amplified by the buffer circuit 38.

Next, at time t4, the control signals φSH2R and φSH3 are caused to transition from the high level to the low level to cause all of the switches 36-R and 40 to enter the off state.

In a period from time t3 to time t4, the control signals φSH2G and φSH2B remain at the low level, that is, the switches 36-G and 36-B remain off, and the pixel signals of the G-pixels and the B-pixels are not transferred to the second holding units 42. In other words, the pixel signals transferred to the second holding units 42 are only the pixel signals output from the R-pixels.

Next, in a period from time t5 to time t6, the pixel signals of the R-pixels in the respective columns, which are held by the second holding units 42, are sequentially read out to the horizontal output line 62. Specifically, first, a switch 52 of the switching circuit is turned on with a control signal from the scanning circuit 60, to thereby read out a pixel signal held by the second holding unit 42 to the horizontal output line 62 (readout period). The pixel signal output to the horizontal output line 62 is output after being subjected to predetermined electrical processing in the readout amplifier 70, and is held in the capacitor 68, which is configured to function as a holding unit. Next, the control signal φRES is set to the high level to turn the switch 64 on, to thereby reset the horizontal output line 62 to a reset level voltage (reset period). The series of operations in the readout period and the reset period are performed sequentially for the second holding units 42 in the respective columns to successively read out the pixel signals of the R-pixels in the first to ninth columns.

In the period from time t5 to time t6, it is desired that the signal level of the control signal φSH4 have a phase opposite to the signal level of the control signal φRES. In other words, the control signal φSH4 is at the low level when the control signal φRES is at the high level, and the control signal φSH4 is at the high level when the control signal φRES is at the low level. This configuration is adopted to reduce a load of driving the capacitor 68 by the readout amplifier 70, and to reduce settling time of the output signal VOUT.

When the horizontal output line 62 is reset under a state in which the capacitor 68 is connected to the output node of the readout amplifier 70, a signal obtained by amplifying the reset voltage of the horizontal output line 62 is held by the capacitor 68. Therefore, when the pixel signal is to be held by the capacitor 68, the voltage at the reset voltage level of the capacitor 68 is overwritten with the voltage at the pixel signal level.

In this regard, in the driving method according to the present embodiment, although the pixel signal amplified by the readout amplifier 70 is held by the capacitor 68, the signal obtained by amplifying the reset voltage of the horizontal output line 62 is not held by the capacitor 68 because the switch 66 is off when the switch 64 is on. In other words, the pixel signal amplified by the readout amplifier 70 is selectively held by the capacitor 68. Therefore, it is sufficient to overwrite the pixel signal of the R-pixel held by the capacitor 68 with a pixel signal of an R-pixel in the next column, and the settling time of the output signal VOUT may be reduced as compared to the case where the voltage at the reset voltage level is overwritten with the voltage at the pixel signal level.

Moreover, the horizontal output line 62 has a parasitic capacitor, and hence it takes a corresponding amount of time to reset the horizontal output line 62. Even if the pixel signal read out to the horizontal output line 62 cannot be completely reset in the reset operation, the pixel signal to be read out next is a pixel signal of the same color. Therefore, the color mixing does not occur, and the color reproducibility is not deteriorated.

Next, at time t7, the control signal φSH2G and the control signal φSH3 are caused to transition from the low level to the high level to turn the switches 36-G and the switches 40 on. As a result, the first holding unit 34-G in each column is connected to the second holding unit 42 in each column via the switch 36-G, the buffer circuit 38, and the switch 40. Then, the pixel signal held by the first holding unit 34-G in each column is held by the second holding unit 42 in each column after being amplified by the buffer circuit 38.

Next, at time t8, the control signals φSH2G and φSH3 are caused to transition from the high level to the low level to cause all of the switches 36-G and 40 to enter the off state.

In a period from time t7 to time t8, the control signals φSH2R and φSH2B remain at the low level, that is, the switches 36-R and 36-B remain in the off state, and the pixel signals of the R-pixels and the B-pixels are not transferred to the second holding units 42. In other words, the pixel signals transferred to the second holding units 42 are only the pixel signals output from the G-pixels.

Next, in a period from time t9 to time t10, the pixel signals of the G-pixels in the respective columns, which are held by the second holding units 42, are sequentially read out to the horizontal output line 62 in the same manner as the operation of reading out the pixel signals of the R-pixels in the respective columns in the period from time t5 to time t6.

Next, at time t11, the control signal φSH2B and the control signal φSH3 are caused to transition from the low level to the high level to turn the switches 36-B and the switches 40 on. As a result, the first holding unit 34-B in each column is connected to the second holding unit 42 in each column via the switch 36-B, the buffer circuit 38, and the switch 40. Then, the pixel signal held by the first holding unit 34-B in each column is held by the second holding unit 42 in each column after being amplified by the buffer circuit 38.

Next, at time t12, the control signals φSH2B and φSH3 are caused to transition from the high level to the low level to cause all of the switches 36-B and 40 to enter the off state.

In a period from time t11 to time t12, the control signals φSH2R and φSH2G remain at the low level, that is, the switches 36-R and 36-G remain in the off state, and the pixel signals of the R-pixels and the G-pixels are not transferred to the second holding units 42. In other words, the pixel signals transferred to the second holding units 42 are only the pixel signals output from the B-pixels.

Next, in a period from time t13 to time t14, the pixel signals of the B-pixels in the respective columns, which are held by the second holding units 42, are sequentially read out to the horizontal output line 62 in the same manner as the readout operation of the pixel signals of the R-pixels in the respective columns in the period from time t5 to time t6.

In this manner, pixel signals of pixels 12 of the same color may be successively read out as in the first and second embodiments, and hence the electric color mixing between the pixel signals of the pixels 12 of different colors may be suppressed.

Moreover, in the present embodiment, in reading out the pixel signals to the first holding units 34, the pixel signals of all pixels are regularly held in the order of R, G, and B. In this operation, the pixel signals of all pixels 12 are simultaneously read out in parallel. Therefore, even when the readout takes time, time required to read out a pixel signal of one pixel 12, that is, a bit rate is not significantly reduced. When readout and holding of the pixel signals in the first holding units 34 takes time in the period from time t1 to time t2 of FIG. 8, the electric color mixing hardly occurs even when a pixel signal of a different color is held by the next first holding unit 34.

Moreover, in the photoelectric conversion device according to the present embodiment, as illustrated in FIG. 7, the holding circuit 30 includes the first holding units and the second holding units 42. With the holding circuit 30 including the two holding units: the first holding units 34 and the second holding units 42, a further effect to be described below may be obtained.

In the photoelectric conversion device according to the second embodiment, as illustrated in FIG. 4, the holding circuit 30 includes one holding unit 34. Here, the holding unit 34 holds a voltage in a capacitor (capacitors CS1 and CN1 of FIG. 5). The horizontal output line 62 has a parasitic capacitor. When a capacitance value of the capacitor of the holding unit 34 is represented by Cl, a capacitance value of the parasitic capacitor of the horizontal output line 62 is represented by Cp, and a voltage held by the capacitor of the holding unit 34 is represented by Vl, the voltage of the horizontal output line 62 is V1×C1/(C1+Cp), and sensitivity is reduced. In order to suppress the reduction in sensitivity, the capacitance value Cl of the capacitor of the holding unit needs to be increased. To that end, in the photoelectric conversion device according to the second embodiment, all capacitance values (areas) of capacitors of twenty-seven holding units 34 included in the holding circuit 30 need to be increased.

In contrast, in the photoelectric conversion device according to the present embodiment, only capacitance values (areas) of capacitors of nine second holding units 42 need to be increased. The buffer circuit 38 is inserted between the first holding unit 34 and the second holding unit 42, and the reduction in sensitivity in reading out the pixel signal from the first holding unit 34 does not occur. Therefore, in the photoelectric conversion device according to the present embodiment, the capacitance value of the capacitor of the first holding unit 34 may be reduced. Further, in order to suppress a reduction in gain in reading out the pixel signal of the second holding unit 42 to the horizontal output line 62, the capacitance value of the capacitor of the second holding unit 42 is increased. As a result, as compared to the second embodiment, the area of the holding circuit 30 may be reduced while suppressing the reduction in sensitivity.

As described above, according to the present embodiment, in the photoelectric conversion device including the pixel array including the pixels of different colors in each row and each column, the electric color mixing between pixel signals acquired from pixels of different colors may be prevented. As a result, the reduction in color reproducibility in reproducing the captured image may be suppressed.

[Fourth Embodiment]

Figure 9:
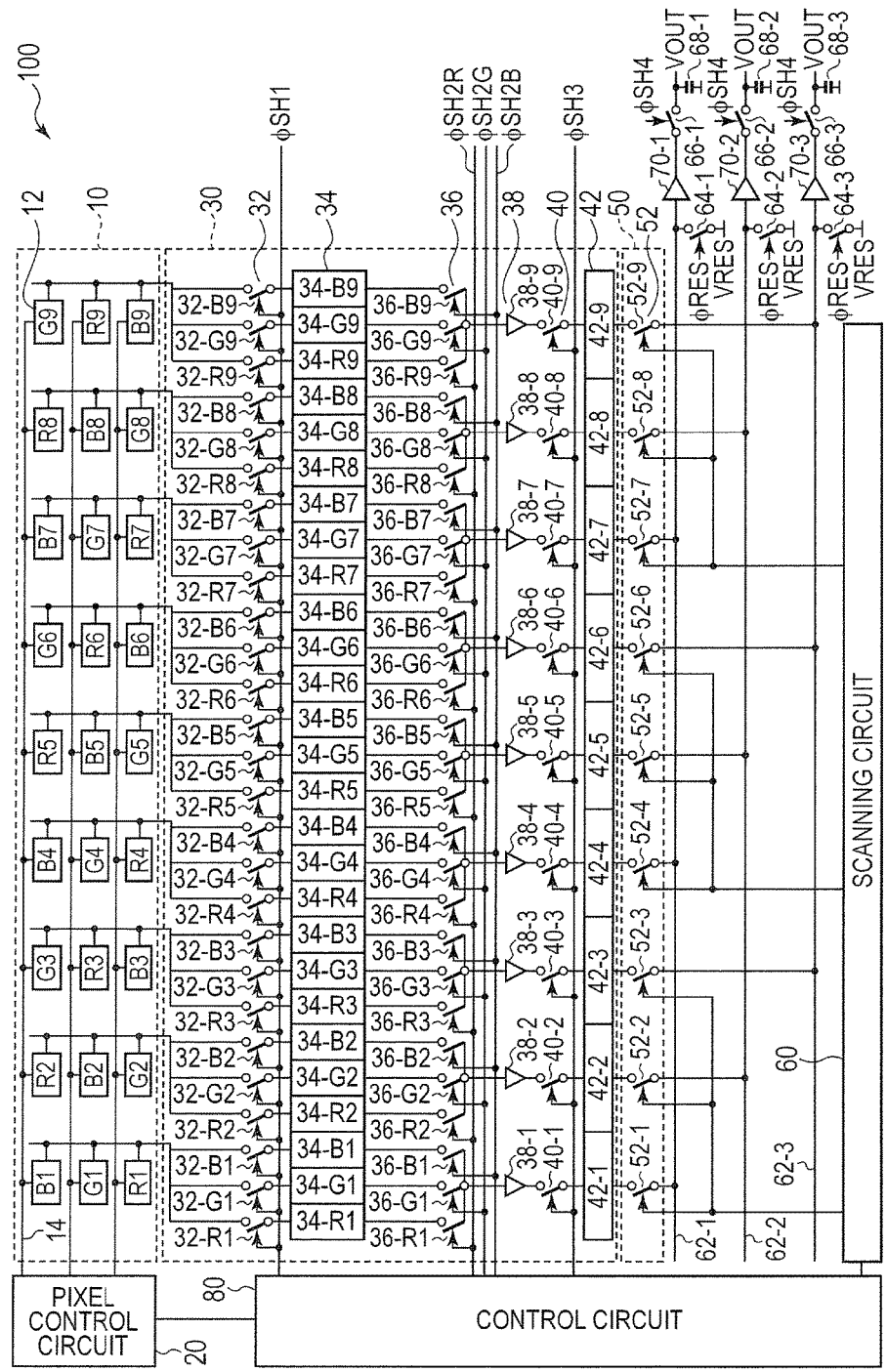
FIG. 9 is a schematic diagram for illustrating a configuration of a photoelectric conversion device according to a fourth embodiment of the present invention.

A photoelectric conversion device and a method of driving the same according to a fourth embodiment of the present invention will be described with reference to FIG. 9. FIG. 9 is a schematic diagram for illustrating a configuration of the photoelectric conversion device according to the present embodiment. Constitutional elements similar to those in the photoelectric conversion device according to the first to third embodiments illustrated in FIG. 1 to FIG. 8 are denoted by the same reference symbols, and the description thereof is omitted or simplified.

As illustrated in FIG. 9, the photoelectric conversion device according to the present embodiment is similar to the photoelectric conversion device according to the third embodiment illustrated in FIG. 7 except that horizontal output lines 62 and subsequent components form three channels.

Specifically, as illustrated in FIG. 9, a photoelectric conversion device 100 according to the present embodiment includes a first channel formed of a horizontal output line 62-1, a readout amplifier 70-1, switches 64-1 and 66-1, and a capacitor 68-1. The photoelectric conversion device 100 also includes a second channel formed of a horizontal output line 62-2, a readout amplifier 70-2, switches 64-2 and 66-2, and a capacitor 68-2. The photoelectric conversion device 100 further includes a third channel formed of a horizontal output line 62-3, a readout amplifier 70-3, switches 64-3 and 66-3, and a capacitor 68-3.

Second holding units 42-1, 42-4, and 42-7 are connected to the horizontal output line 62-1 via switches 52-1, 52-4, and 52-7, respectively. Second holding units 42-2, 42-5, and 42-8 are connected to the horizontal output line 62-2 via switches 52-2, 52-5, and 52-8, respectively. Second holding units 42-3, 42-6, and 42-9 are connected to the horizontal output line 62-3 via switches 52-3, 52-6, and 52-9, respectively.

The photoelectric conversion device may be configured as described above to output signals from the respective channels in parallel. For example, in regard to the R-pixels, pixel signals of pixels 12-R1, 12-R4, and 12-R7, pixel signals of pixels 12-R2, 12-R5, and 12-R8, and pixel signals of pixels 12-R3, 12-R6, and 12-R9 may be read out in parallel. In other words, in the timing chart of FIG. 8, each of the period from time t5 to time t6, the period from time t9 to time t10, and the period from time t13 to time t14 may be reduced to ⅓. Moreover, the pixel signals read out at the same time to the horizontal output lines 62-1, 62-2, and 62-3 are pixel signals of pixels 12 of the same color.

Even if pixel signals of pixels 12 of the same color are successively read out in each channel, when pixel signals of pixels 12 of different colors are read out in another channel, electric color mixing may occur between the channels.

However, in the photoelectric conversion device according to the present embodiment, pixel signals from pixels 12 of the same color are successively read out in each channel, and pixel signals from pixels 12 of the same color are read out at the same time in all channels. Therefore, electric color mixing among the horizontal output lines 62-1, 62-2, and 62-3 does not occur, and the reduction in color reproducibility may be suppressed.

As described above, according to the present embodiment, in the photoelectric conversion device including the pixel array including the pixels of different colors in each row and each column, the electric color mixing between pixel signals acquired from pixels of different colors may be prevented. As a result, the reduction in color reproducibility in reproducing the captured image may be suppressed.

[Fifth Embodiment]

An image reading apparatus and an image forming apparatus according to a fifth embodiment of the present invention will be described with reference to FIG. 10.

In the present embodiment, an example of the image reading apparatus and the image forming apparatus, to which the photoelectric conversion device according to each of the first to fourth embodiments is applied, is described. Examples of the image reading apparatus and the image forming apparatus include, but not particularly limited to, a copying machine and a multi-function printer. It should be noted, however, that the photoelectric conversion device according to each of the first to fourth embodiments may be applied to various apparatus that include a photoelectric conversion device, without limiting to the image reading apparatus and image forming apparatus described in the present embodiment.

Figure 10:
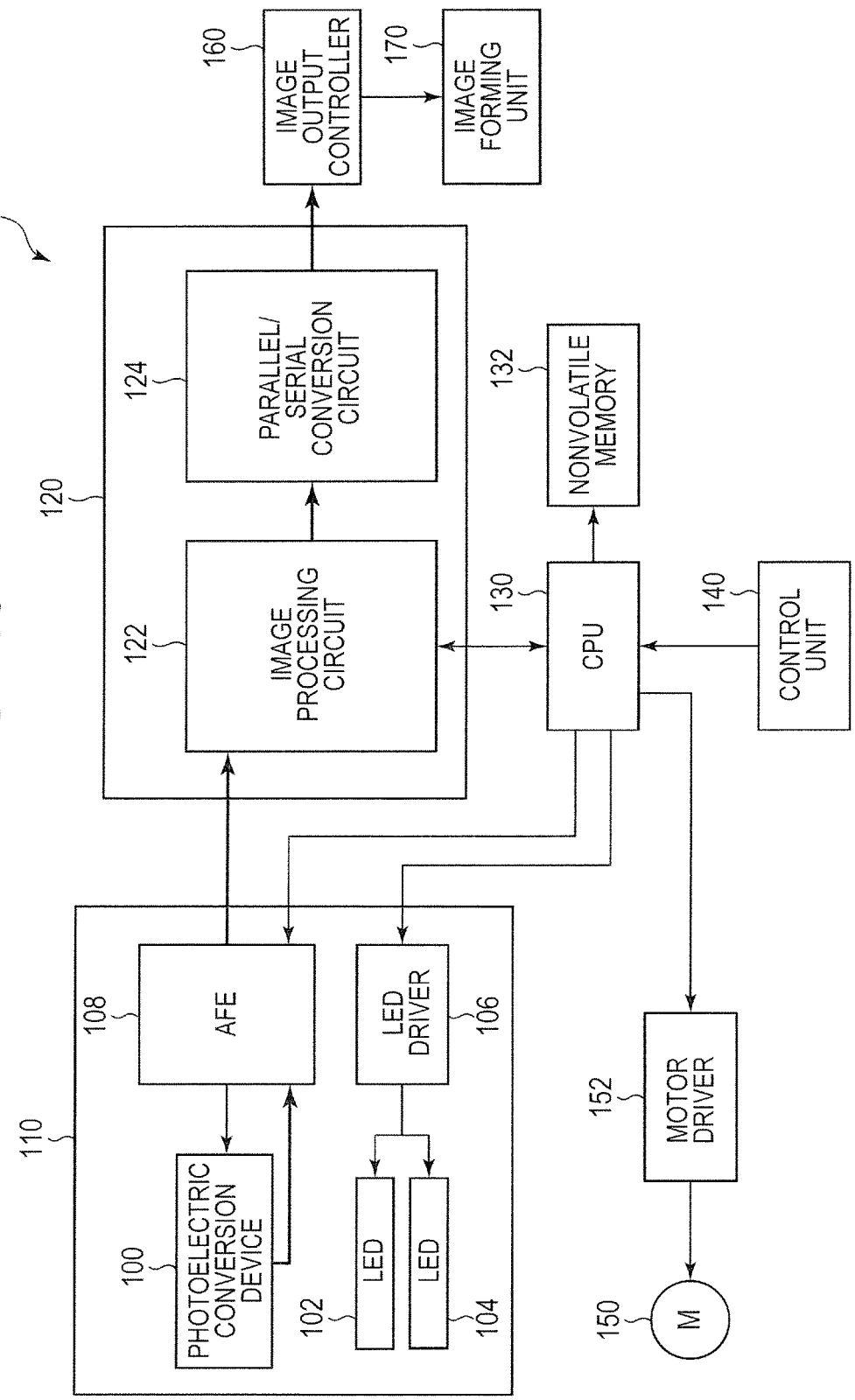
FIG. 10 is a block diagram for illustrating a configuration of an image reading apparatus according to a fifth embodiment of the present invention.

An image reading apparatus 200 according to the present embodiment includes, as illustrated in FIG. 10, a reading unit 110, an image processing unit 120, a central processing unit (CPU) 130, a nonvolatile memory 132, a control unit 140, a motor 150, a motor driver 152, and an image output controller 160. The reading unit 110 includes a photoelectric conversion device 100, light emitting diodes (LEDs) 102 and 104, an LED driver 106, and an integrated circuit (IC) 108. The image processing unit 120 includes an image processing circuit 122 and a parallel/serial conversion circuit 124.

The CPU 130 reads a control program stored in the nonvolatile memory 132 to perform overall control of the image reading apparatus 200. The control unit 140 is a user interface used by a user to input settings on a copy mode, such as color copying, monochrome copying, or double-sided copying, and an instruction to start copying.

The LED driver 106 is configured to receive a timing signal from the CPU 130 to supply a current for causing light emitting units, that is, the white LEDs 102 and 104 to emit light. As a result, the LEDs 102 and 104 irradiate an object (document), from which an image is to be read, with light. The photoelectric conversion device 100 is configured to receive light reflected from the document, and to convert the received light into an electrical signal through photoelectric conversion, to thereby output an analog voltage signal corresponding to the amount of incident light. The IC 108 is configured to perform analog processing, such as sample-and-hold processing, offset processing, and gain processing, on the analog voltage signal output from the photoelectric conversion device 100, and to convert the voltage signal, on which the analog processing has been performed, into digital data (hereinafter referred to as "luminance data"). The IC 108 is generally called an analog front end (AFE). A part or all of functions of the IC 108 may be incorporated into the photoelectric conversion device 100.

The motor 150 is configured to move the reading unit 110 in the sub-scanning direction. The motor driver 152 is configured to receive a timing signal from the CPU 130 to supply an excitation current for controlling the motor 150 to rotate.

The image processing circuit 122 is configured to perform image processing, such as shading correction processing and filtering, on the read data output from the IC 108. Settings and the like of a filter, which are required to perform the image processing, are set to a register in the image processing circuit 122 by the CPU 130 when the image reading apparatus 200 is powered on. The parallel/serial conversion circuit 124 is configured to convert the read data after the various kinds of image processing, which is output as parallel data from the image processing circuit 122, into serial data. The read data converted into the serial data is transmitted to the image output controller 160.

The read data transmitted to the image output controller 160 is sent to the image forming unit 170. The image reading apparatus 200 and the image forming unit 170 form the image forming apparatus. An example of a known image forming unit 170 is an electrophotographic image forming unit. The electrophotographic image forming unit 170 is configured to form an image by developing an electrostatic latent image, which is formed on a photosensitive drum, to form a toner image, and transferring the toner image onto a recording medium, e.g., paper. In this manner, the image forming apparatus may form the image read by the image reading apparatus 200 on the recording medium by the image forming unit.

As described in the first to fourth embodiments, the photoelectric conversion device according to each of the above-mentioned embodiments effectively suppresses the electric color mixing of the pixel signals between pixels of different colors. Therefore, the photoelectric conversion device according to each of the above-mentioned embodiments may be used to realize the image reading apparatus, which is capable of acquiring an image having good quality without color mixing, and an image forming apparatus, which is excellent in color reproducibility.

[Modified Embodiments]

The present invention is not limited to the above-mentioned embodiments, and various modifications may be made thereto.

For example, in the above-mentioned embodiments, the photoelectric conversion device including the pixel array 10 including three kinds of pixels 12, that is, the R-pixels, the G-pixels, and the B-pixels, has been described, but the combination of colors is not necessarily limited to R, G, and B. Moreover, the kinds of pixels 12 need not necessarily limited to the three kinds, but may be increased or decreased as necessary and as appropriate, e.g., four kinds. The number of rows of the pixel array 10 may be increased or decreased depending on the kinds of pixels 12. Moreover, the pixel array 10 may include pixels other than the pixels configured to output the pixel signals corresponding to the incident light, and may include dummy pixels, for example.

Moreover, the circuit configurations of the pixels 12, the holding units 34, the switches 52, and other such components of FIG. 5 are illustrated as an example, and may be changed as appropriate. For example, in the pixel 12, the select transistor M4 may be omitted.

Moreover, the timings to read out from the second holding units 42 to the horizontal output line 62, the timing to reset the horizontal output line 62, and the timing to sample and hold the output of the readout amplifier 70, which are described in the third embodiment, may be applied to the first or second embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-026970, filed Feb. 16, 2016 which is hereby incorporated by reference herein in its entirety.

What is claimed is:

1. A photoelectric conversion device comprising:
a pixel array including a plurality of pixels arranged in a plurality of rows and a plurality of columns, each of the plurality of pixels being configured to output a pixel signal, and including an optical filter and a photoelectric conversion unit configured to photoelectrically convert light transmitted through the optical filter, wherein optical filters of different colors are arranged for each of the plurality of rows and each of the plurality of columns;
a holding circuit; and
an output signal line,
wherein the holding circuit includes a plurality of groups, each including first holding units, each group is provided for corresponding one column of the plurality of columns, the first holding units included in one group being configured to hold in parallel each other, the pixel signals read out from a plurality of pixels including the optical filters of different colors with each other, and
wherein the photoelectric conversion device further comprises a readout circuit configured to successively read out the pixel signals of pixels including the optical filters of the same color from each of the plurality of groups to the output signal line.

2. The photoelectric conversion device according to claim 1,
wherein the holding circuit further includes a plurality of second groups, each of the plurality of second groups has second holding units, each second group is provided for corresponding one column of the plurality of columns, and
wherein the readout circuit is configured to transfer pixel signals of pixels including the optical filters of the same color, among the pixel signals of the plurality of pixels held by each of the first holding units of the plurality of groups, to corresponding one of the plurality of second groups, in parallel, and to successively read out the pixel signals held by each of the plurality of second groups to the output signal line.

3. The photoelectric conversion device according to claim 2,
wherein the holding circuit further includes a plurality of buffer circuits each arranged between an output of one of the plurality of groups and an input of one of the plurality of second groups.

4. The photoelectric conversion device according to claim 2,
wherein each of the plurality of first holding units includes a first capacitor having a first capacitance value, and
wherein each of the plurality of second holding units includes a second capacitor having a second capacitance value larger than the first capacitance value.

5. The photoelectric conversion device according to claim 2,
wherein the photoelectric conversion device comprises a plurality of the output signal lines, and
wherein the readout circuit is configured to read out the pixel signals of the pixels including the optical filters of the same color to the plurality of the output signal lines in parallel.

6. The photoelectric conversion device according to claim 2, further comprising:
a reset circuit configured to reset a potential of the output signal line;
an amplifier circuit connected to the output signal line; and
a third holding unit configured to hold the pixel signal output from the amplifier circuit,
wherein the reset circuit is configured to perform a reset operation for resetting the potential of the output signal line after a readout operation for outputting the pixel signal from the readout circuit to the output signal line, and
wherein the third holding unit is configured to hold the pixel signal, which is output from the amplifier circuit in the readout operation.

7. The photoelectric conversion device according to claim 2, wherein the readout circuit is configured to simultaneously transfer the pixel signals of the plurality of pixels to corresponding one group of the plurality of groups.

8. The photoelectric conversion device according to claim 2, wherein each of the optical filters of pixels in one column has one of different colors, and the optical filters of pixels in one row have colors regularly and repeatedly arranged.

9. The photoelectric conversion device according to claim 2, wherein the readout circuit is configured to transfer the pixel signals of the plurality of pixels from the pixel array to the plurality of first holding units so that the plurality of first holding units, which are configured to hold the pixel signals of the plurality of pixels, are regularly arranged to correspond to colors of the optical filters of the plurality of pixels.

10. The photoelectric conversion device according to claim 2, wherein the readout circuit is configured to transfer the pixel signals of a plurality of pixels in a plurality of rows arranged in one column from the pixel array to corresponding one group of the plurality of groups, in parallel.

11. The photoelectric conversion device according to claim 1,
wherein the photoelectric conversion device comprises a plurality of the output signal lines, and
wherein the readout circuit is configured to read out the pixel signals of the pixels including the optical filters of the same color to the plurality of the output signal lines in parallel.

12. The photoelectric conversion device according to claim 1, further comprising:
a reset circuit configured to reset a potential of the output signal line;
an amplifier circuit connected to the output signal line; and
a third holding unit configured to hold the pixel signal output from the amplifier circuit,
wherein the reset circuit is configured to perform a reset operation for resetting the potential of the output signal line after a readout operation for outputting the pixel signal from the readout circuit to the output signal line, and wherein the third holding unit is configured to hold the pixel signal, which is output from the amplifier circuit in the readout operation.

13. The photoelectric conversion device according to claim 1, wherein the readout circuit is configured to simultaneously transfer the pixel signals of the plurality of pixels to corresponding one group of the plurality of groups.

14. The photoelectric conversion device according to claim 1, wherein each of the optical filters of pixels in one column has one of different colors, and the optical filters of pixels in one row have colors regularly and repeatedly arranged.

15. The photoelectric conversion device according to claim 1, wherein the readout circuit is configured to transfer the pixel signals of the plurality of pixels from the pixel array to the plurality of first holding units so that the plurality of first holding units, which are configured to hold the pixel signals of the plurality of pixels, are regularly arranged to correspond to colors of the optical filters of the plurality of pixels.

16. The photoelectric conversion device according to claim 1, wherein the readout circuit is configured to transfer the pixel signals of a plurality of pixels in a plurality of rows arranged in one column from the pixel array to the plurality of first holding units in parallel.

17. A method of driving a photoelectric conversion device including a pixel array including a plurality of pixels arranged in a plurality of rows and a plurality of columns, each of the plurality of pixels being configured to output a pixel signal, and including an optical filter and a photoelectric conversion unit configured to photoelectrically convert light transmitted through the optical filter, wherein the optical filters of different colors are arranged for each of the plurality of rows and each of the plurality of columns; and a plurality of groups, each of the plurality of groups having first holding units, and each group provided for corresponding one column of the plurality of columns, the method comprising:

holding, by each of the plurality of groups, the pixel signals read out from a plurality of pixels provided in corresponding one column of the pixel array and including the optical filters of different colors with each other in parallel; and successively reading out the pixel signals of pixels including the optical filters of the same color from each of the plurality of groups.

18. An image reading apparatus configured to read an image of an object comprising:

a light emitting unit configured to irradiate the object with light; and the photoelectric conversion device according to claim 1, configured to receive light reflected by the object, and to convert the received light into an electrical signal.

19. An image forming apparatus, comprising:

an image reading apparatus configured to read an image of an object; and an image forming unit configured to form an image based on a signal acquired by the image reading apparatus, wherein the image reading apparatus includes:

a light emitting unit configured to irradiate the object with light; and the photoelectric conversion device according to claim 1, configured to receive light reflected by the object, and to convert the received light into an electrical signal.

* * * * *